United States Patent
Tamura

Patent Number: 6,001,511
Date of Patent: Dec. 14, 1999

[54] MASK FOR USE IN A PROJECTION ELECTRON BEAM EXPOSURE

[75] Inventor: Takao Tamura, Tokyo, Japan

[73] Assignee: NEC Corporation, Tokyo, Japan

[21] Appl. No.: 09/050,943

[22] Filed: Mar. 31, 1998

[30] Foreign Application Priority Data

Mar. 31, 1997 [JP] Japan ..................................... 9-080007

[51] Int. Cl.⁶ ....................................................... G03F 9/00
[52] U.S. Cl. .............................................. 430/5; 430/296
[58] Field of Search ............................... 430/5, 322, 296, 430/22

[56] References Cited

U.S. PATENT DOCUMENTS 5,723,233   3/1998   Garza et al. ................................ 430/5

FOREIGN PATENT DOCUMENTS 4-261012    9/1992   Japan .
5-335221   12/1993   Japan .

*Primary Examiner*—S. Rosasco
*Attorney, Agent, or Firm*—Foley & Lardner

[57] ABSTRACT

An electron beam exposure mask comprises a mask body and a plurality of unit patterns each having an opening pattern iteratively formed in the mask. The mask body has a thickness profile controlled based on the opening density of the pattern in the mask area.

3 Claims, 10 Drawing Sheets

FIG. 2
(PRIOR ART)
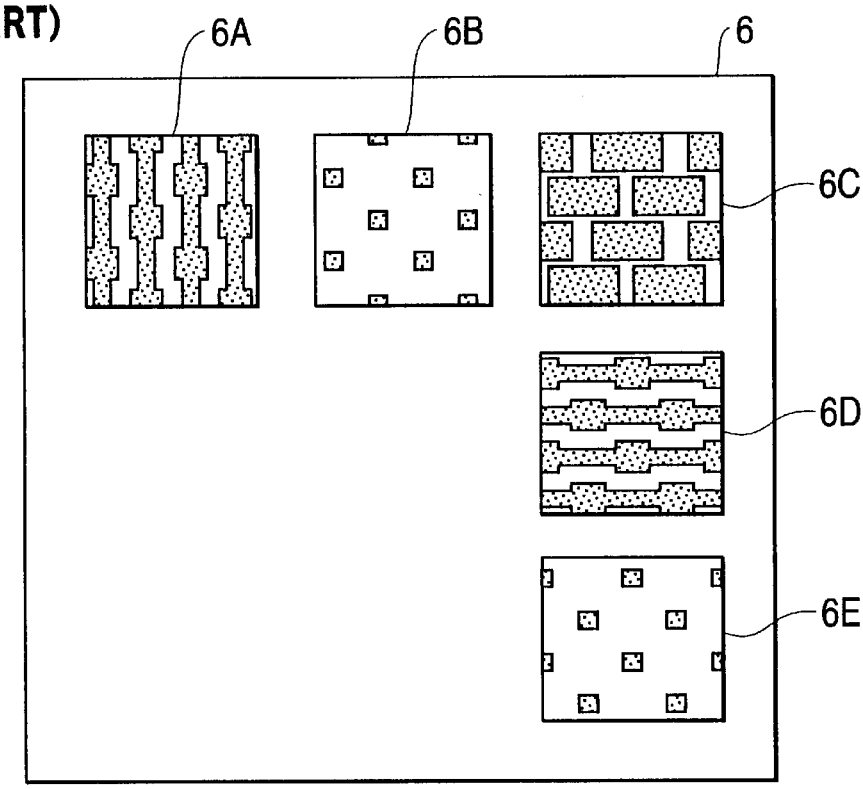
FIG. 3
(PRIOR ART)
FIG. 3A
(PRIOR ART)
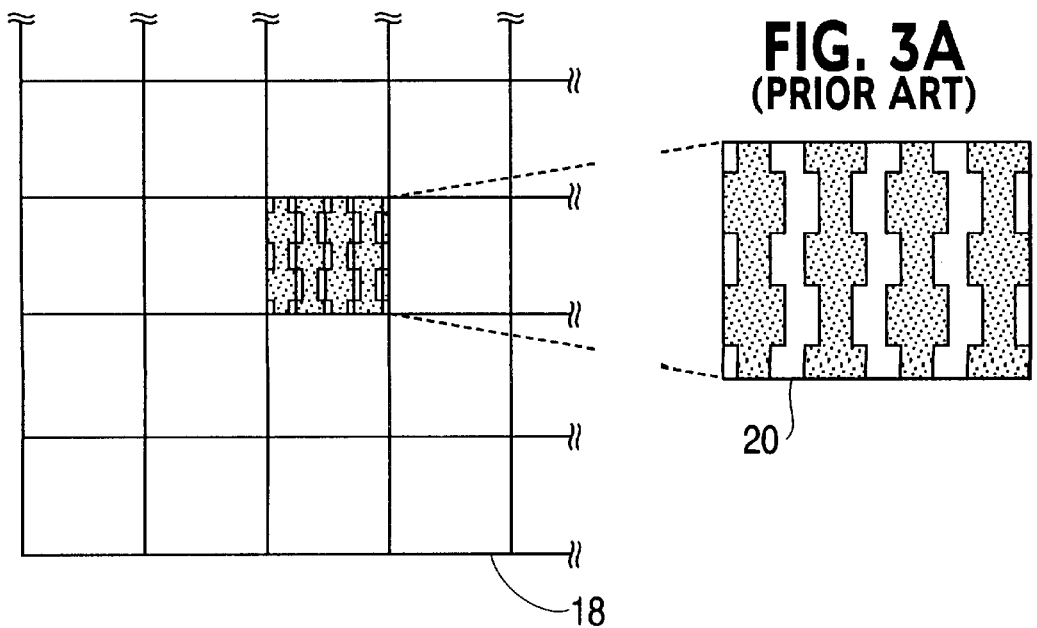

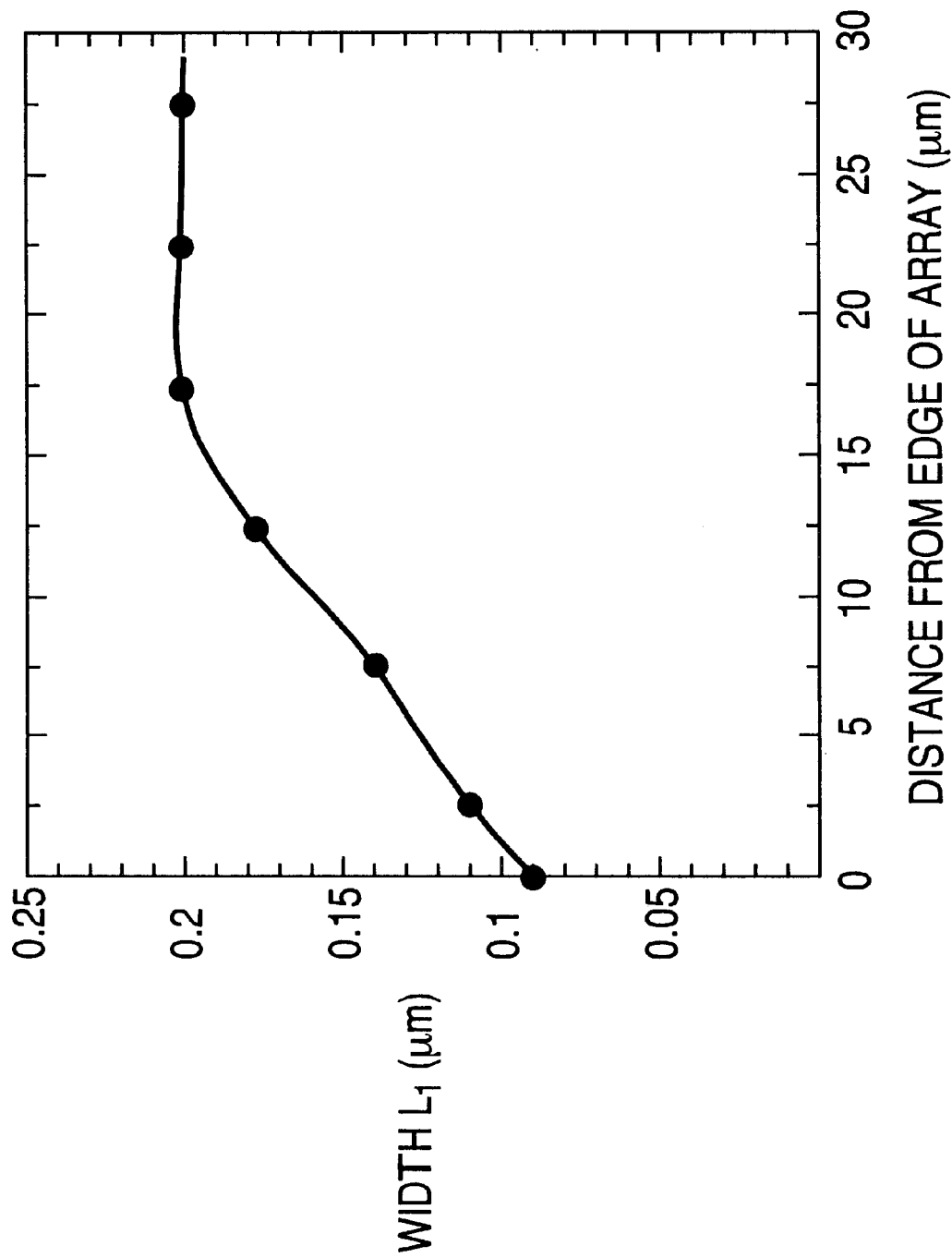

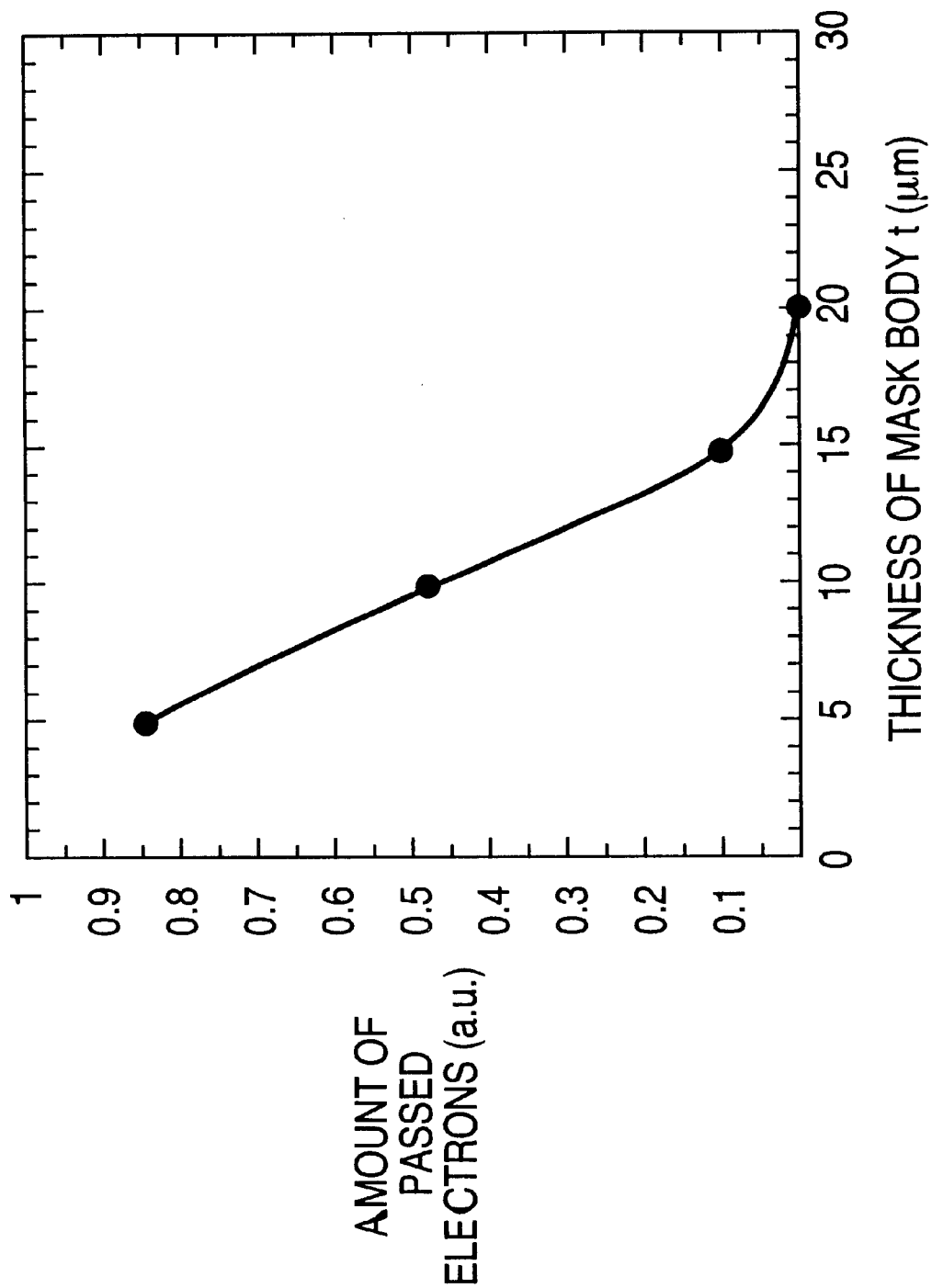

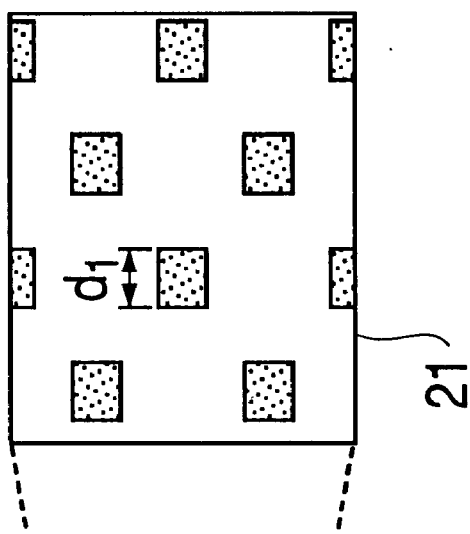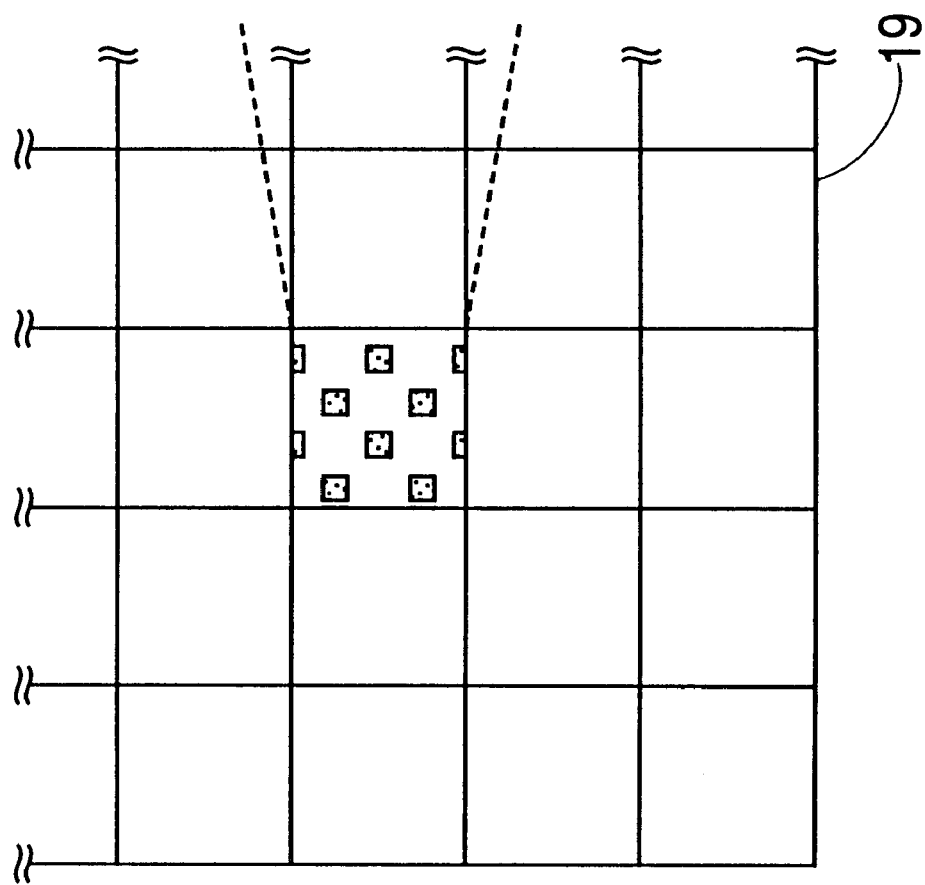

MASK FOR USE IN A PROJECTION ELECTRON BEAM EXPOSURE

BACKGROUND OF THE INVENTION (a) Field of the Invention

The present invention relates to a mask for use in a projection electron beam exposure and, more particularly, to a projection exposure mask capable of forming a uniform pattern on a semiconductor wafer by correcting a proximity effect.

(b) Description of the Related Art

With the development of LSIs, the line pattern formed on the semiconductor device has become rapidly finer and finer. An electron beam exposure technique is expected to provide a finer pattern designed with as low as 0.25 µm design rule in the next generation semiconductor devices.

FIG. 1 shows a known projection electron beam exposure system in a block diagram. The projection exposure system comprises a first mask 3 having a rectangular opening 3A for passing a rectangular electron beam 50A and a second mask 6 having a patterned opening in the area aligned with the rectangular opening 3A of the first mask 3 for passing a patterned electron beam 50B. The patterned electron beam 50B passed by the second mask 6 is irradiated onto the surface of a semiconductor wafer 11 to transfer the pattern 6B of the second mask 6 in a reduction projection scheme onto the surface of the semiconductor wafer 11 applied with a resist film thereon. The first mask 3 functions for defining the size of the electron beam used for a single exposure step, wherein the size of the electron beam 50A is slightly larger than the area for the pattern of the second mask 6.

The second mask 6 used for fabrication of a memory device, wherein a unit pattern is iteratively formed in the whole cell area, generally has a size corresponding to the size for the unit pattern. The patterned electron beam 50B passed by the second mask 6 forms a latent image in the unit area on the resist mask in a single exposure step.

Alternatively, the second mask 6 may have a plurality of unit patterns, such as 6A to 6E shown in FIG. 2, which are derived from the design data for an LSI. Or, the size of the patterned area may correspond to the chip of the LSI, wherein the second mask has a single patterned opening for the entire chip area of the LSI.

Back to FIG. 1, the electron beam 50 emitted from an electron gun 1 passes through a blanking electrode 2, the first mask 3, a shaping lens 4, a shaping deflector 5, the second mask 6, a reduction lens 7, a main deflector 8, an auxiliary deflector 9 and a projection lens 10 to be incident onto the semiconductor water 11 fixed on a stage 12. The patterned electron beam 50B passed by the second mask 6 is reduced in size by the reduction lens 7, deflected by the main deflector 8 and the auxiliary deflector 9 to be incident onto the specified portion of the semiconductor wafer 11.

The computer (CPU) 14 selects a specified pattern data out of a plurality of pattern data stored in a pattern data storage device 17, stores the selected pattern data in a memory 17, and operates for processing using the stored data. Specifically, the stored data is transferred from the CPU 14 through a controller 16 to the blanking electrode 2, shaping deflector 5, main deflector 8 and auxiliary deflector 9 for irradiating the patterned electron beam 50B onto the specified portion of the semiconductor wafer 11.

The electron beam exposure system as described above has an advantage over the conventional electron beam exposure system using a variably shaped electron beam in that the number of beam shots is reduced down to 1/10 or 1/100 compared to the conventional electron beam exposure system. As a result, the time length necessary to the exposure is reduced to improve the throughput of the exposure.

FIG. 3 shows an example of a unit pattern 20 iteratively transferred onto a semiconductor wafer by using the opening pattern 6A in the second mask of FIG. 2 to form a memory cell array 18. In this process, there arises a defect called "proximity effect" wherein the pattern density difference involved between the central part and the peripheral area of the cell array 18 provides different pattern dimensions between the central part and the peripheral part of the photoresist due to the change in the exposure intensity from adjacent openings.

FIG. 4 shows the relationship between the width ($L_1$ in FIG. 3) of a line in the photoresist pattern and the distance of the location of the line from the edge of the cell array. For example, the exposure mask which provides a width of 0.2 µm for a line in the central area of the cell array provides a width as low as 0.1 µm in the peripheral area. Since the exposure intensity is not generally changed in the projection exposure process, the proximity effect involves a critical problem.

Patent Publication JP-A-4-26012 proposes to solve the proximity effect in the projection exposure process for a semiconductor chip by changing the pattern size in the second mask. FIG. 5A shows a plurality of unit patterns in the second mask proposed by the publication, and FIG. 5B shows the cross-section taken along line B—B in FIG. 5A. The proposed mask 26 has a larger size in some of the unit patterns 26A used for the peripheral area of the cell array compared to the unit pattern 26B used in the central area of the cell array.

It involves a complicated procedure, however, to select one of the unit patterns 26A and 26B depending on the location of the electron beam in the exposure step using the proposed exposure mask 26.

Patent Publication JP-A-5-335221 proposes another solution for the proximity effect, as shown in FIG. 6, wherein a main pattern 36A and an auxiliary pattern 36 B are formed on a single second mask 36. An auxiliary exposure or GHOST exposure is effected, after a main exposure step, by using the auxiliary pattern 36B having a zone opening for exposing the peripheral area of the chip.

The proposed technique, however, increases the number of exposure steps to thereby reduce the through-put of the exposure.

SUMMARY OF THE INVENTION

It is therefore an object of the present invention to provide a new projection exposure process capable of providing a uniform pattern over the entire area of the mask or entire area of the chip without increasing the number of the exposure steps.

The present invention provides an exposure mask for use in an exposure system using charged particles, the exposure mask comprising a mask body, and an opening pattern having a plurality of openings formed in the mask body for passing the charged particles, the mask body having a profile for controlling an amount of charged particles per unit area passing the mask body other than the opening, the profile being based on an area of the openings per unit area.

In accordance with the present invention, the amount of the electron exposure is controlled based on the area of the openings itself and the location of the exposure in the mask depending on the profile, which provides a correction of the proximity effect without an increase of an exposure step or a proximity effect.

The above and other objects, features and advantages of the present invention will be more apparent from the following description, referring to the accompanying drawings.

BRIEF DESCRIPTION OF THE DRAWINGS

FIG. 2 is a top plan view of a second mask for use in the electron beam exposure system of FIG. 1;

FIG. 3 is a top plan view of a cell array formed by the second mask of FIG. 2;

FIG. 4 is a graph showing the relationship between the width of a line and the distance between the line and the edge of the chip when the second mask of FIG. 2 is used for obtaining the array of FIG. 3;

FIG. 9 is a graph showing the relationship between the amount of electrons passing the mask of FIG. 7A and the thickness of the mask body, when the array of FIG. 3 is to be formed by using the mask of FIG. 7A;

FIG. 10 is a partial top plan view of a cell array formed by using a mask according to a second embodiment of the present invention.

PREFERRED EMBODIMENT OF THE INVENTION

Figure 1:
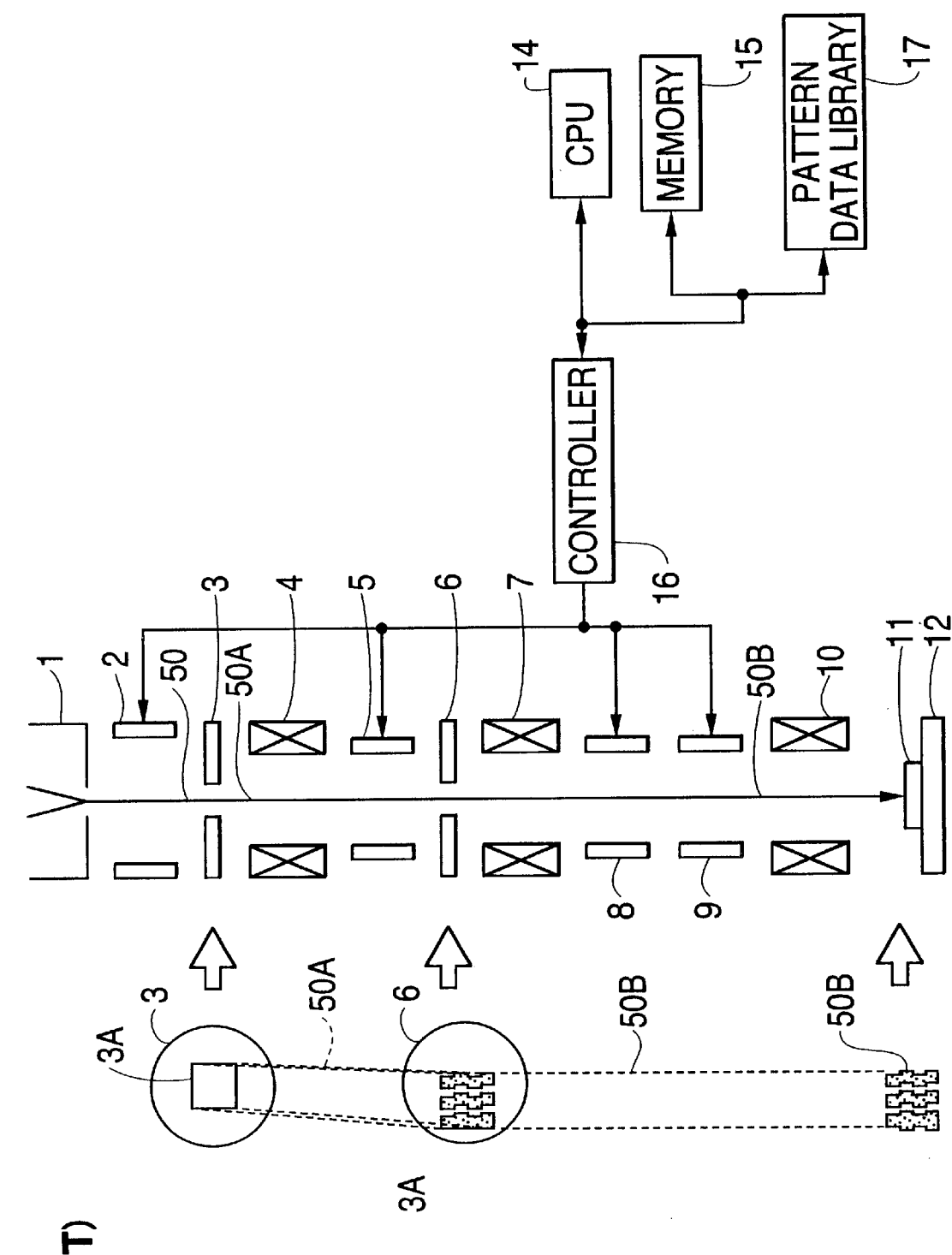
FIG. 1 is a schematic cross-sectional view of a conventional electron beam exposure system.
Figure 5A:
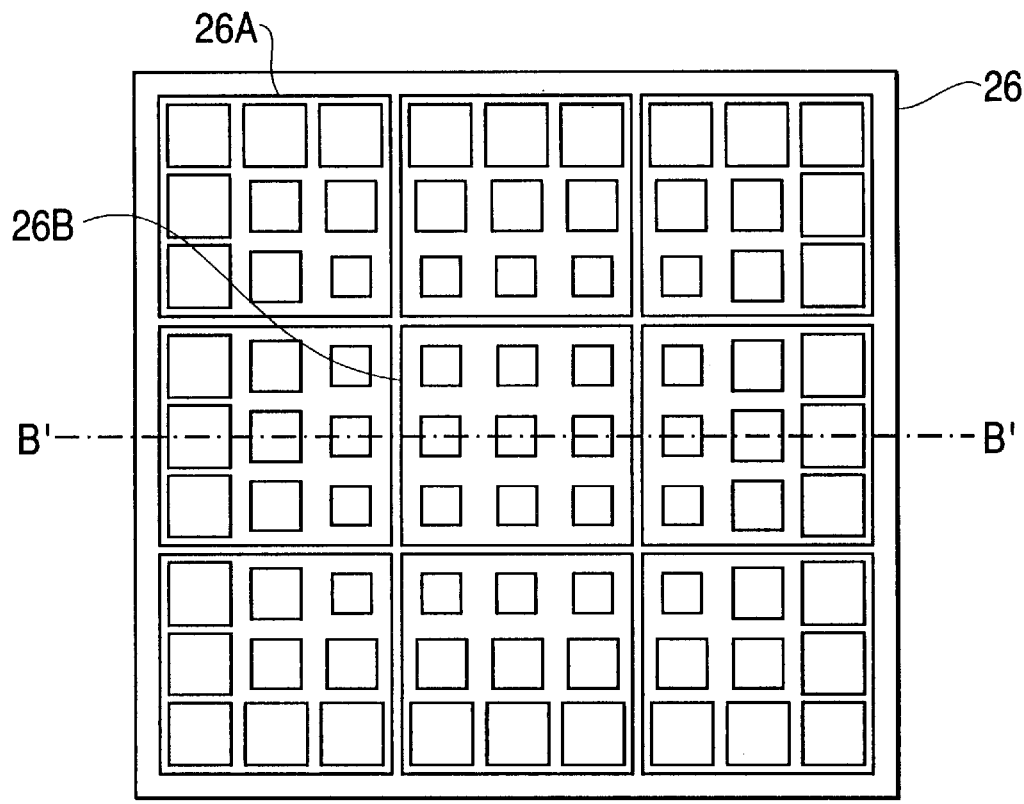
FIG. 5A is a top plan view of a mask proposed in a patent publication.
Figure 5B:
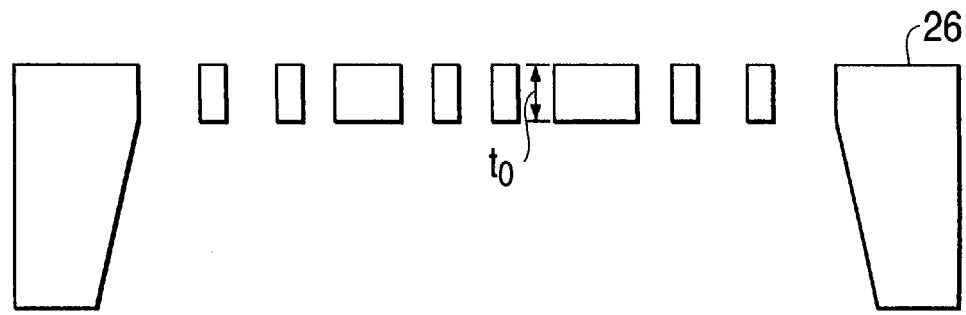
FIG. 5B is a cross-sectional view of the mask of FIG. 5A taken along line B-B' in FIG. 5A.
Figure 6:
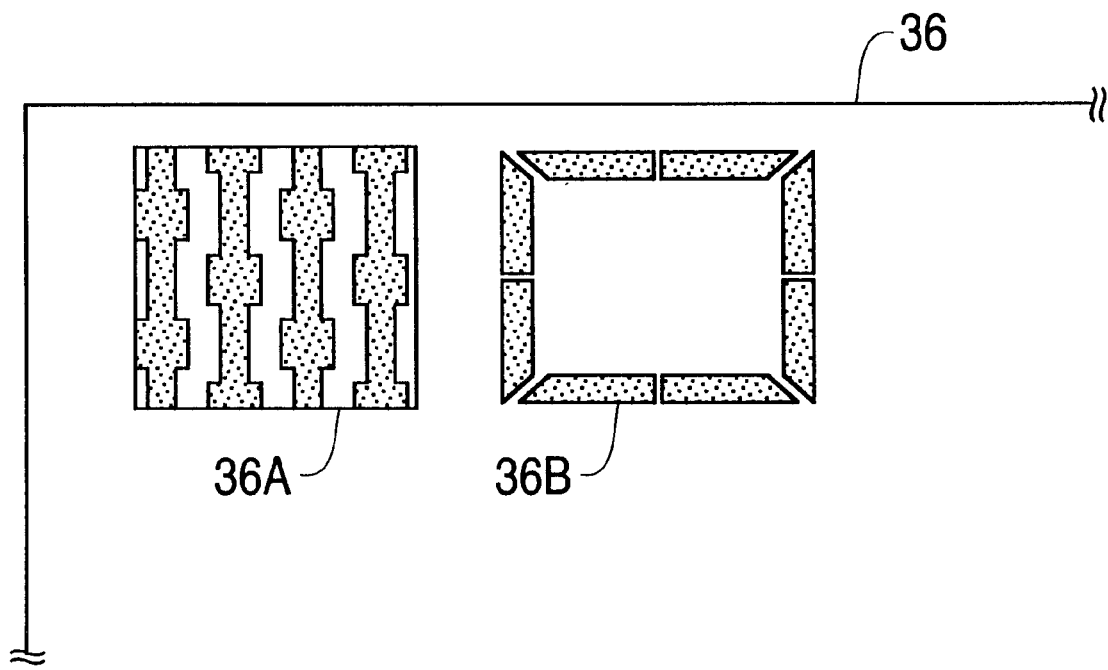
FIG. 6 is a partial top plan view of a mask proposed in another patent publication.

Now, the present invention is more specifically described with reference to accompanying drawings, wherein similar constituent elements are designated by related reference numerals throughout the drawings.

Figure 7A:
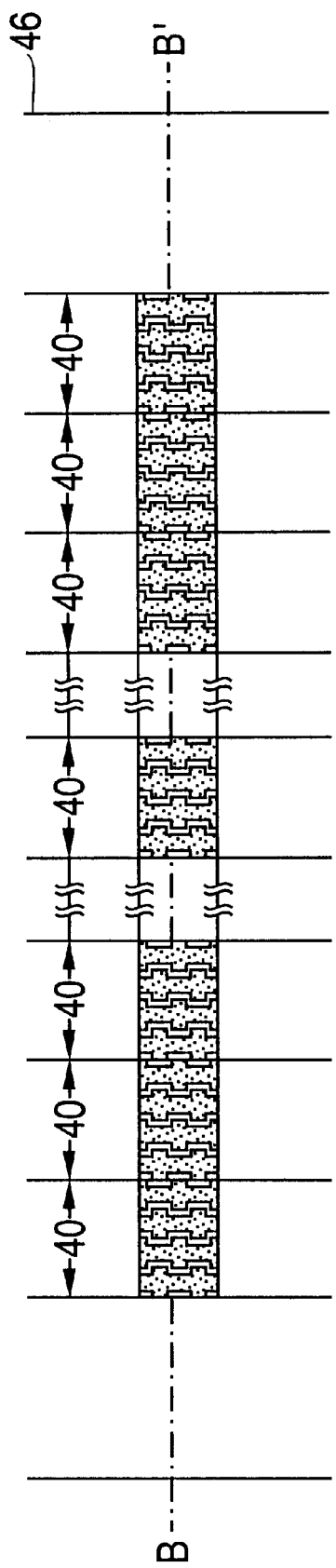
FIG. 7A is a partial top plan view of a mask according to an embodiment of the present invention for use in the electron beam exposure system of FIG. 1 as the second mask.
Figure 7B:
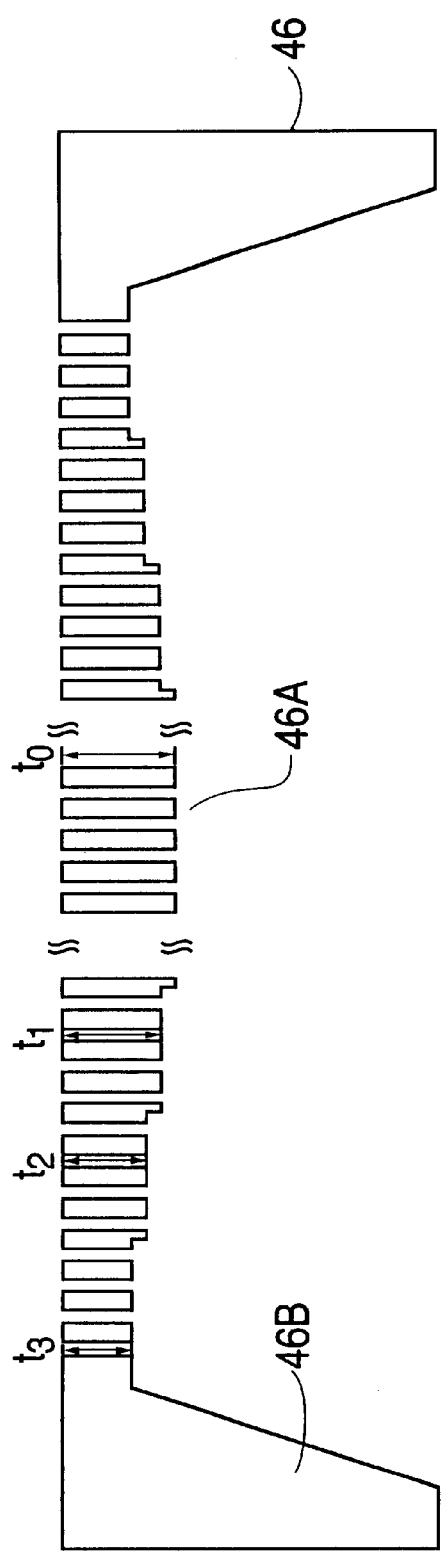
FIG. 7B is a cross-sectional view of the mask of FIG. 7A taken along line B-B' in FIG. 7A.

Referring to FIGS. 7A and 7B, an exposure mask according to a first embodiment of the present invention is used as the second mask in the electron beam exposure system of FIG. 1 to fabricate the cell array of FIG. 3, wherein a unit pattern is iteratively formed in the array.

The exposure mask according to the present embodiment comprises a silicon body 46 having therein a plurality of unit opening patterns 40 for forming an array of a semiconductor memory device by a single projection electron beam exposure step for the entire array area The silicon body 46 has a peripheral support portion 463 having a large thickness and a main mask area 46A having openings in the unit patterns 40. The mask area 46A of the silicon body 46 has a central portion having a thickness larger than the thickness of a peripheral portion of the mask area 46A. The thickness of the silicon body 46 is controlled depending on the density of the pattern openings according to the present invention, wherein the central portion of the mask area 46A having a highest density for the pattern openings has a largest thickness and the thickness is reduced monotonically along the radius from the center toward the periphery of the mask area 46A. The term "pattern density" as used herein means an area of the openings in a unit area, or a ratio of an area of the openings to a total area that includes the openings and adjacent solid portion.

The controlled thickness of the silicon body 46 varying depending on the density of the opening patterns provides the control of the amount of electrons passing through the silicon body 46 other than the openings. Specifically, the central portion of the mask area having a high opening density has a larger thickness for reducing the amount of electrons passing the silicon body itself, whereas the peripheral portion of the mask having a lower opening density has a smaller thickness for increasing the amount of electrons passing the silicon body itself. By this configuration, equivalent sizes of the pattern, such as a width (L1) of a line, can be obtained on the semiconductor wafer from both the central portion and the peripheral portion of the exposure mask, thereby canceling the proximity effect. The exposure mask has all the patterns for one array area and allows projection electron beam exposure for the entire array area.

In FIGS. 7A and 7B, although the cross-section along line B—B is illustrated, the cross-section of the silicon body perpendicular to line B—B also has a similar profile.

Figure 8:
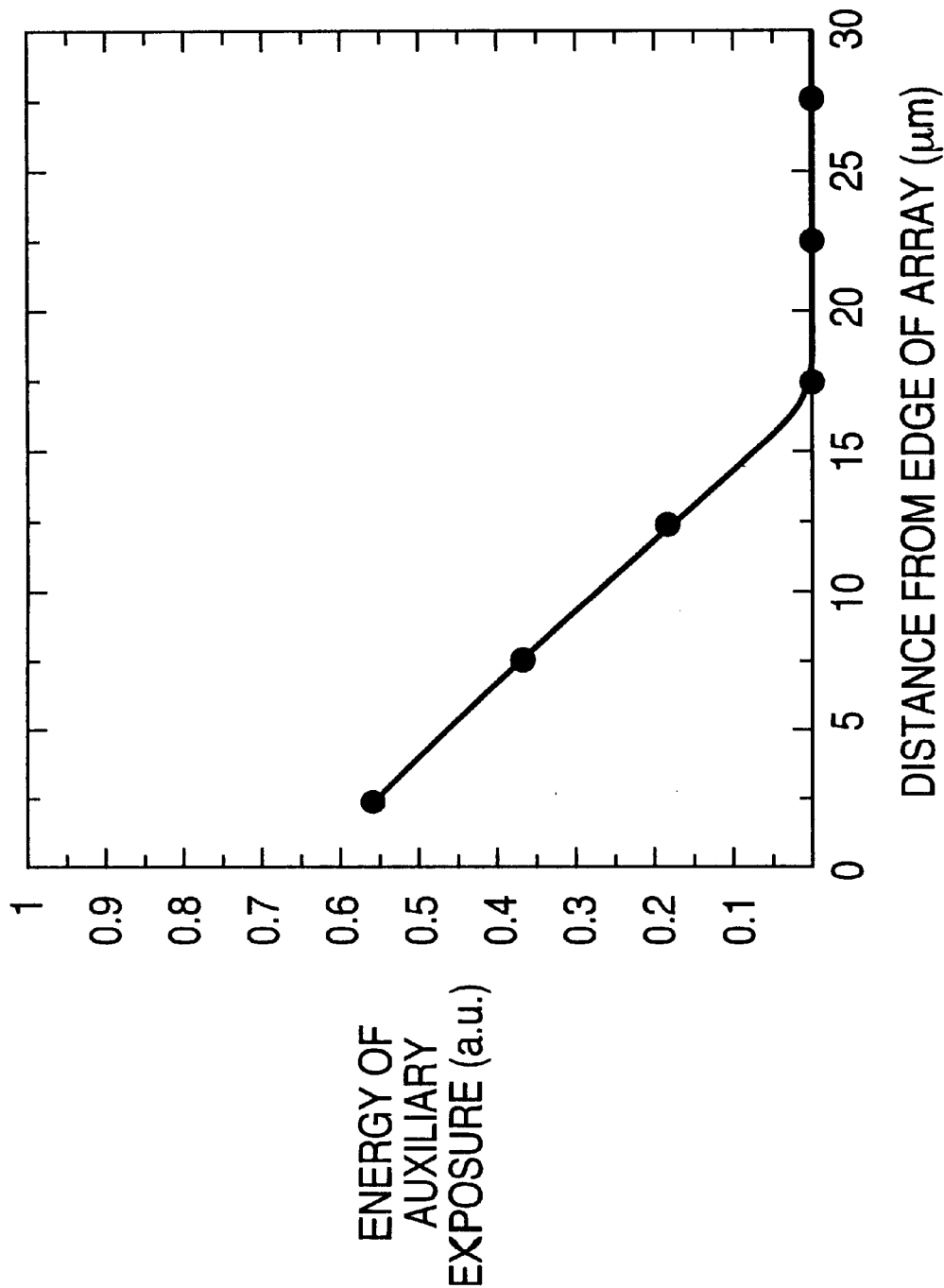
FIG. 8 is a graph showing the relationship between the energy of the auxiliary exposure beam and the distance between the exposed location and the edge of the array, when the array of FIG. 3 is to be formed.

Now, the steps for designing the thickness of the silicon body will be described. The entire array area is first divided into a plurality of regions each having a specified size, and the pattern density in each region is calculated from the ratio of the opening area to the total area. The energy of the auxiliary beam necessary for correcting the proximity effect is then calculated in each region based on the pattern density to obtain a graph such as shown in FIG. 8, wherein the energy necessary for the auxiliary exposure is calculated as a function of the distance of the exposed location from the edge of the array in the case of the chip shown in FIG. 3, wherein the correction is effected up to a distance of 17 pm from the edge of the array.

Subsequently, the amount of electrons capable of passing through the silicon body is calculated as a function of the thickness of the silicon body to obtain the graph of FIG. 9, wherein the amount of passing electrons varies substantially depending on the thickness between 0 and 20 $\mu$m. The thickness of the exposure mask in the present embodiment is then calculated based on the graphs of FIGS. 8 and 9. The thickness of the silicon body of FIG. 7B is designed for the cell array 18 of FIG. 3, wherein thicknesses $t_0$, $t_1$, $t_2$ and $t_3$ viewed from the center to the periphery of the mask area are 20 $\mu$m, 13.5 $\mu$m, 11.2 $\mu$m and 8.8 $\mu$m, respectively, in the total mask area having a length of a few millimeters, which depends on the chip size. The thicknesses of the silicon body can be controlled by using a usual fabrication process for a semiconductor device.

The mask as designed above was used in the electron beam exposure system of FIG. 1 to fabricate the chip of FIG. 3, wherein a plurality of unit patterns are iteratively formed on the array area and specified openings had a line width of $L_1$=0.2 $\mu$m. After the exposure, it was confirmed that the error of the line width L1 by using the exposure mask of the embodiment fell within ±5 percent of $L_1$, which was satisfactory.

Figure 11:
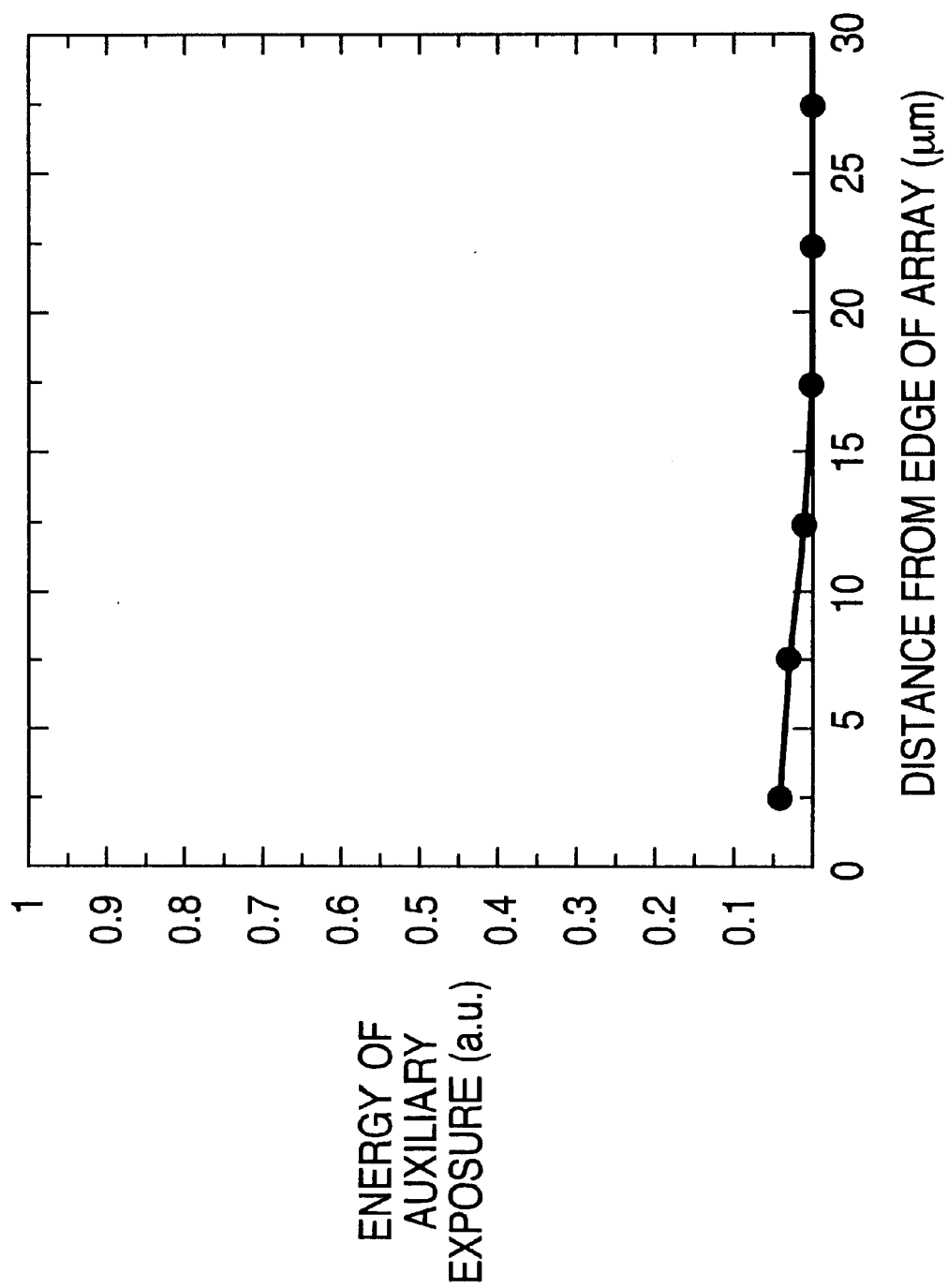
FIG. 11 is a graph showing the relationship between the energy of the auxiliary exposure beam and the distance between the exposed location and the edge of the array, when the array of FIG. 10 is to be formed.

An exposure mask according to a second embodiment of the present invention, which has a profile similar to that of FIG. 7B, is used for fabrication of a cell array 19 shown in FIG. 10, wherein a plurality of unit patterns 21 are iteratively formed on the chip area. Each unit pattern 21 has a plurality of square openings having a size of $d_1=0.2$ μm. The thickness of the silicon body is calculated based on the necessary amount of electrons in an auxiliary exposure for correcting the proximity effect, such as shown in FIG. 11, similarly to the first embodiment. The thicknesses $t_0$, $t_1$, $t_2$ and $t_3$ thus designed were 20 μm, 18 μm, 17 μm and 16.5 μm, respectively.

The exposure mask as designed above was used in the electron exposure system of FIG. 1 to obtain the pattern shown in FIG. 10, wherein a plurality of unit patterns 21 each having therein a plurality of square openings having a side of $d_1$ (0.2 μm) are iteratively formed on a chip. The error of the size fell within ±5 percent of $d_1$, which was satisfactory.

In both the above embodiments, an electron beam exposure process is exemplified. However, the present invention is applicable to any charged particle exposure process such as an ion beam exposure process. In addition, the mask pattern may have one or more of unit patterns for a cell array or any other pattern such as for a peripheral area of a memory cell.

If a cell array has a plurality of unit pattern areas to be formed in a plurality of projection exposure processes, a mask may have a standard unit pattern having a standard thickness to be used in a central region of the cell array and some of the other unit patterns used for the peripheral region having a smaller thickness for correcting the proximity effect.

Since the above embodiments are described only for examples, the present invention is not limited to the above embodiments and various modifications or alterations can be easily made therefrom by those skilled in the art without departing from the scope of the present invention.

What is claimed is:

1. An exposure mask for use in an exposure system using charged particles, said exposure mask comprising a mask body material defining an opening pattern comprising a plurality of openings for passing the charged particles, said mask body material having a thickness profile for controlling an amount of charged particles per unit area passing through said mask body material, said thickness profile being based on an area of said openings per unit area.

2. An exposure mask as defined in claim 1, wherein said pattern includes a plurality of unit patterns iteratively formed in the exposure mask.

3. An exposure mask as defined in claim 1, wherein said plurality of unit patterns correspond to an entire area of a semiconductor chip.

* * * * *